US012437963B2

(12) United States Patent
Kaplan

(10) Patent No.: US 12,437,963 B2
(45) Date of Patent: Oct. 7, 2025

(54) DEEP STRUCTURE SIGNAL DETECTION AND ENHANCEMENT BY SEPARATION TO UPPER (TOPOGRAPHY) AND LOWER (BOTTOM) AREAS FOR ROBUST BLIND DENOISING SELF SUPERVISION (BDSS)

(71) Applicant: ETROLOGY, LLC, Sandy, OR (US)

(72) Inventor: Vladislav Kaplan, Baanana (IL)

(73) Assignee: ETROLOGY, LLC, Sandy, OR (US)

( * ) Notice: Subject to any disclaimer, the term of this patent is extended or adjusted under 35 U.S.C. 154(b) by 351 days.

(21) Appl. No.: 18/357,686

(22) Filed: Jul. 24, 2023

(65) Prior Publication Data

US 2025/0035438 A1 Jan. 30, 2025

(51) Int. Cl.
*H01J 37/22* (2006.01)

(52) U.S. Cl.
CPC .................................. *H01J 37/222* (2013.01)

(58) Field of Classification Search
USPC ........................................................ 250/307
See application file for complete search history.

(56) References Cited

U.S. PATENT DOCUMENTS 7,751,046 B2 * 7/2010 Levy ...................... G01N 21/27 356/636
2006/0278826 A1 * 12/2006 Roberts .................. H01J 37/28 250/310
2018/0350614 A1 * 12/2018 Liao ....................... H01L 21/76

* cited by examiner

*Primary Examiner* — Kiet T Nguyen
(74) *Attorney, Agent, or Firm* — Stanzione & Associates, PLLC; Patrick Stanzione

(57) ABSTRACT

A method of deep structure detection of deep structure signals for a critical dimension scanning electron microscope (CDSEM) image by dividing the image into separate upper and lower regions using self-tunable masking and then denoising and enhancing the upper and lower regions separately, wherein the lower deep structure region is denoised by applying blind denoising by self-supervision (BDSS) thereto.

6 Claims, 3 Drawing Sheets

FIG. 1C
(CONVENTIONAL)
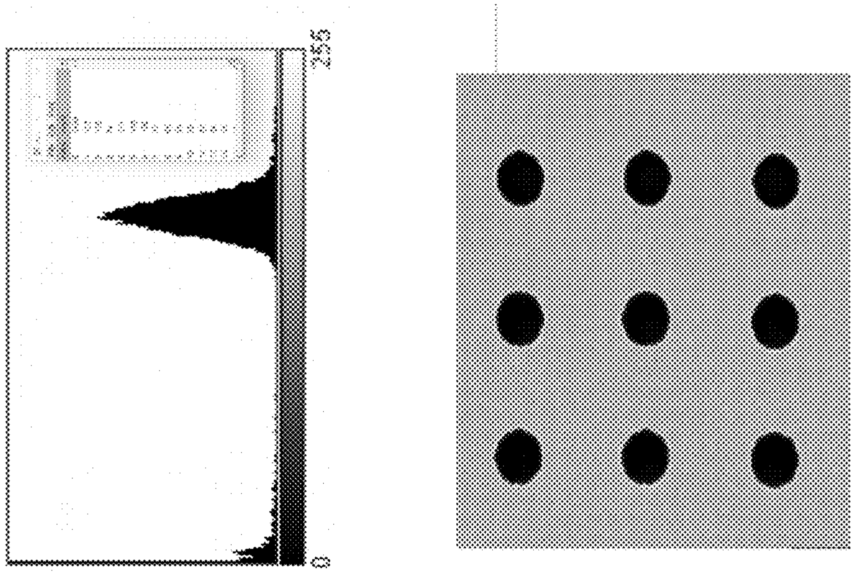
FIG. 1B
(CONVENTIONAL)
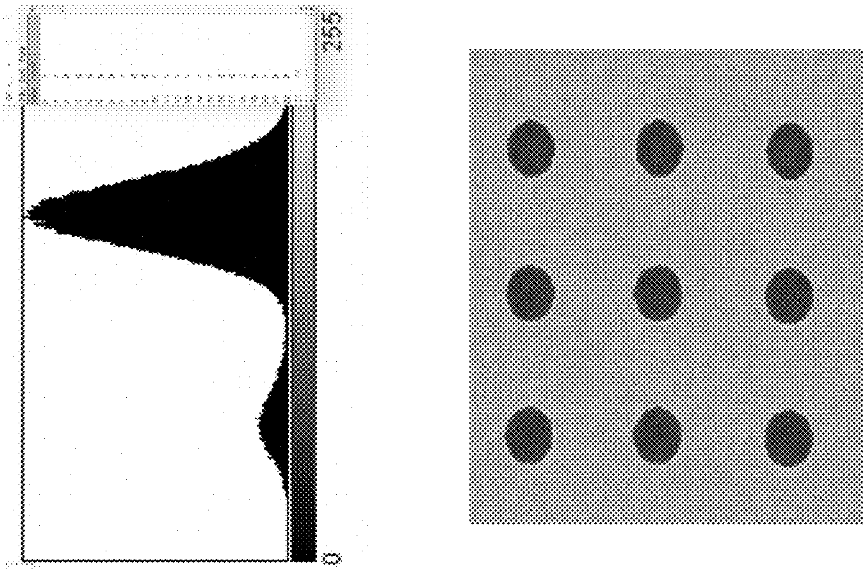
FIG. 1A
(CONVENTIONAL)
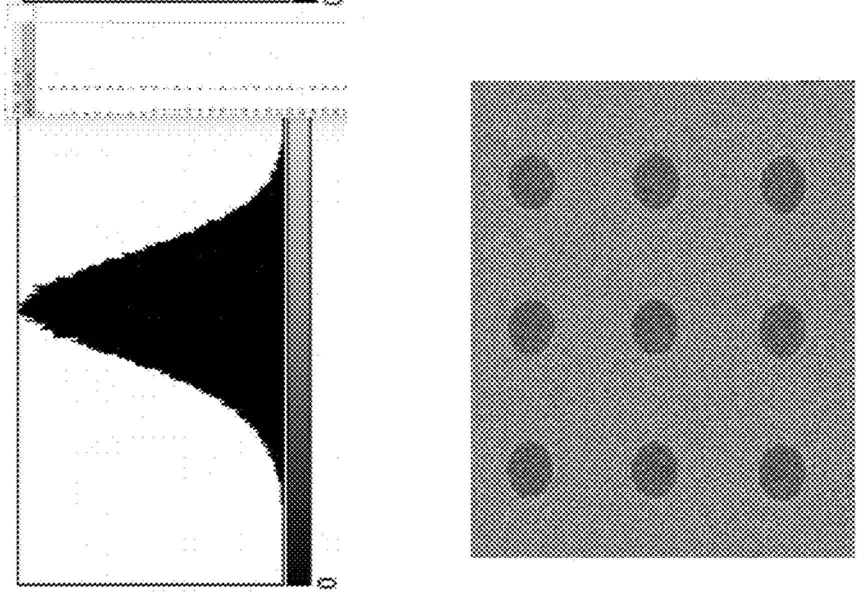

DEEP STRUCTURE SIGNAL DETECTION AND ENHANCEMENT BY SEPARATION TO UPPER (TOPOGRAPHY) AND LOWER (BOTTOM) AREAS FOR ROBUST BLIND DENOISING SELF SUPERVISION (BDSS)

STATEMENT REGARDING FEDERALLY SPONSORED RESEARCH OR DEVELOPMENT

Not applicable.

COPYRIGHT NOTICE

A portion of this disclosure contains material which is subject to copyright protection. The copyright owner has no objection to the photocopy reproduction by anyone of the patent document or the patent disclosure in exactly the form it appears in the Patent and Trademark Office patent file or records, but otherwise reserves all copyright rights whatsoever. 37 C.F.R 1.71(d).

BACKGROUND OF THE INVENTIVE CONCEPT

Field of the Invention

The present inventive concept relates to deep structure signal detection using critical dimension scanning electron microscopy (CDSEM). More particularly, but not exclusively, this inventive concept relates to a process of detecting deep structure signals by dividing an image into separate upper and lower regions using self-tunable masking and then denoising the upper and lower regions separately.

Description of the Related Art

Integrated circuits are fabricated in multiple layers, one on top of another. During testing for critical dimensions (CD) and/or overlay (OL) buried layers are analyzed for weak signals from bottom/previous layers, which is especially important for electronics memory components. This testing must be conducted using critical dimension scanning electron microscopy (CDSEM) by seeing through one layer in order to detect a layer below it, which requires seeing through cuts to detect a bottom signal. The process of detecting the bottom contact signal is difficult due to an aspect ratio of 20 to 50, where an aspect ratio is the ratio between a depth of a contact/trench and a width of a contact/trench. A common solution used by metrology manufactures is to increase penetration energy, which requires capital spending on new tools or an increase in an integration time for image collection, which in turn could damage the contact/trench and decrease throughput of the image collection tool being used, which in turn will result in higher capital spending.

An innovative approach for detecting deep structure signals has been proposed, which is called auto separation for robust blind-denoising by self-supervision approach. The blind-denoising by self-supervision approach for detecting deep structure signals can collect and enhance bottom signals buried in noise. However, the measurement and treatment of deep structures heavily rely on image enhancement mechanisms that tend to treat the deep structure and surrounding areas as one instance, which has several limitations, especially when the depth of the structures increases. For example, in NAND gate manufacturing, the current contact depth is 10 μm, which is expected to increase to 14 μm, or even up to 18 μm for advanced modes, and in order to keep up with the improvement in manufacturing of semiconductor structures, higher energies and/or acquisition times are required for stable measurement. However, this comes at a cost of throughput and overall complexity.

In addition to the above problems, the conventional processes of detecting deep structure signals have required remaining in one area with a scanning electron beam for a significant time period, which causes damage to the structural contacts. FIGS. 1A-1C illustrate a conventional approach to obtaining a deep structure signal through histogram equalization, where the x-axis represents a gray scale value (from 1-255) of an image obtained (bottom) of an object and the y-axis represents the count of electrons detected (or signal) within the area of the image obtained. FIG. 1A illustrates a histogram (top diagram) of an image taken where a significant amount of noise occurs in obtaining the image (bottom diagram) of an area of an object. The image of the object illustrates contact areas (circles) and non-contact areas of the object. Here an electron beam is positioned on the area of an object for a very short period of time (aka: integration time), which results in a significant amount of noise (here it is observed a merging of all distributions of electrons and clearly an indistinctive population of the electrons emitted from bottom). As illustrated, no count of electrons can be detected with respect to the contact (or trench) region of the image as a result of the significant amount of noise present.

FIG. 1B illustrates a histogram (top diagram) of an image taken with a medium amount of integration time, where some noise occurs in obtaining the image (bottom diagram) of an area of the object. Here an electron beam is positioned on an area of the object for a longer period of time than in FIG. 1A, which results in less noise than in FIG. 1A. As illustrated in FIG. 1B, any count of electrons present with respect to the contact area (or trench area) is still not detectable as a result of the amount of noise present. FIG. 1C illustrates a histogram (top diagram) of an image taken with a high integration time. In other words, an electron beam is positioned on an area of the object for a longer period of time than in FIG. 1B. Here two distinctive peaks are observed: one at 0 on the gray scale (absence of signal) and the other one at approximately 200 on the gray scale, which appears to be a large gaussian distribution. Another very small peak is observed around 1-15 on the gray scale, which represents a bottom signal (lower level of the object being scanned) that needs to be enhanced and measured. As determined by the results in FIG. 1C, a count of electrons is more detectable (see gray scale region from approximately 0-70) by projecting the beam on the area of the object for a long period of time, the amount of time required on the area of the object significantly increases the risk of damage to the area of the object, thus resulting in a very low yield of usable product. In other words, the projection of an electron beam (or other beam detection device) for a longer integration time substantially increases the possibility of causing damage to a semiconductor chip that is being tested for critical dimensions (CD) and/or overlay (OL).

Accordingly, there is a need to provide a process of detecting upper and lower layers of semiconductor structures more efficiently and accurately.

There is also a need to detect lower layers of semiconductor structures separately from upper layers.

There is also a need to detect lower layers of semiconductor structures accurately without causing damage to the semiconductor structures.

SUMMARY OF THE INVENTIVE CONCEPT

The present general inventive concept provides a process of detecting deep structure signals by dividing an image into separate upper and lower regions using self-tunable masking and then denoising the upper and lower regions separately.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a method of deep structure detection for a critical dimension scanning electron microscope (CDSEM) image, the method comprising: obtaining an image of an area of a semiconductor structure having at least two layers using a charged particle imager; obtaining an upper topography region and a bottom deep structure region by applying a self-tunable mask to the obtained image of the area of the semiconductor structure; denoising and enhancing the upper region topography; applying blind denoising by self-supervision (BDSS) to the bottom deep structure region and locally enhancing the denoised bottom deep structure region; and combining the denoised and enhanced upper region topography and the denoised and enhanced bottom deep structure region to obtain a single denoised enhanced image.

In an exemplary embodiment the enhancing the denoised bottom deep structure region can be performed by applying a histogram or a kernel method thereto.

In another exemplary embodiment the denoising and enhancing the upper region topography can be performed by spatial domain filtering and stretching.

The foregoing and/or other features and utilities of the present general inventive concept may also be achieved by providing a non-transitory computer readable medium that performs process steps comprising: controlling a charged particle imager to obtain an image of an area of a semiconductor structure having at least two layers; obtaining an upper topography region and a bottom deep structure region by applying a self-tunable mask to the obtained image of the area of the semiconductor structure; denoising and enhancing the upper region topography; applying blind denoising by self-supervision (BDSS) to the bottom deep structure region and locally enhancing the denoised bottom deep structure region; and combining the denoised and enhanced upper region topography and the denoised and enhanced bottom deep structure region to obtain a single denoised enhanced image.

In an exemplary embodiment the enhancing the denoised bottom deep structure region can be performed by applying a histogram or a kernel method thereto.

In another exemplary embodiment the denoising and enhancing the upper region topography can be performed by spatial domain filtering and stretching.

BRIEF DESCRIPTION OF THE DRAWINGS

These and/or other features and utilities of the present inventive concept will become apparent and more readily appreciated from the following description of the embodiments, taken in conjunction with the accompanying drawings of which:

FIG. 1A illustrates a histogram (top) where a significant amount of noise occurs in obtaining an image (bottom) of an area of an object;

FIG. 1B illustrates a histogram (top) where some noise occurs in obtaining an image (bottom) of an area of the object;

FIG. 1C illustrates a histogram (top) where no noise occurs in obtaining an image (bottom) of an area of the object;

Figure 2:
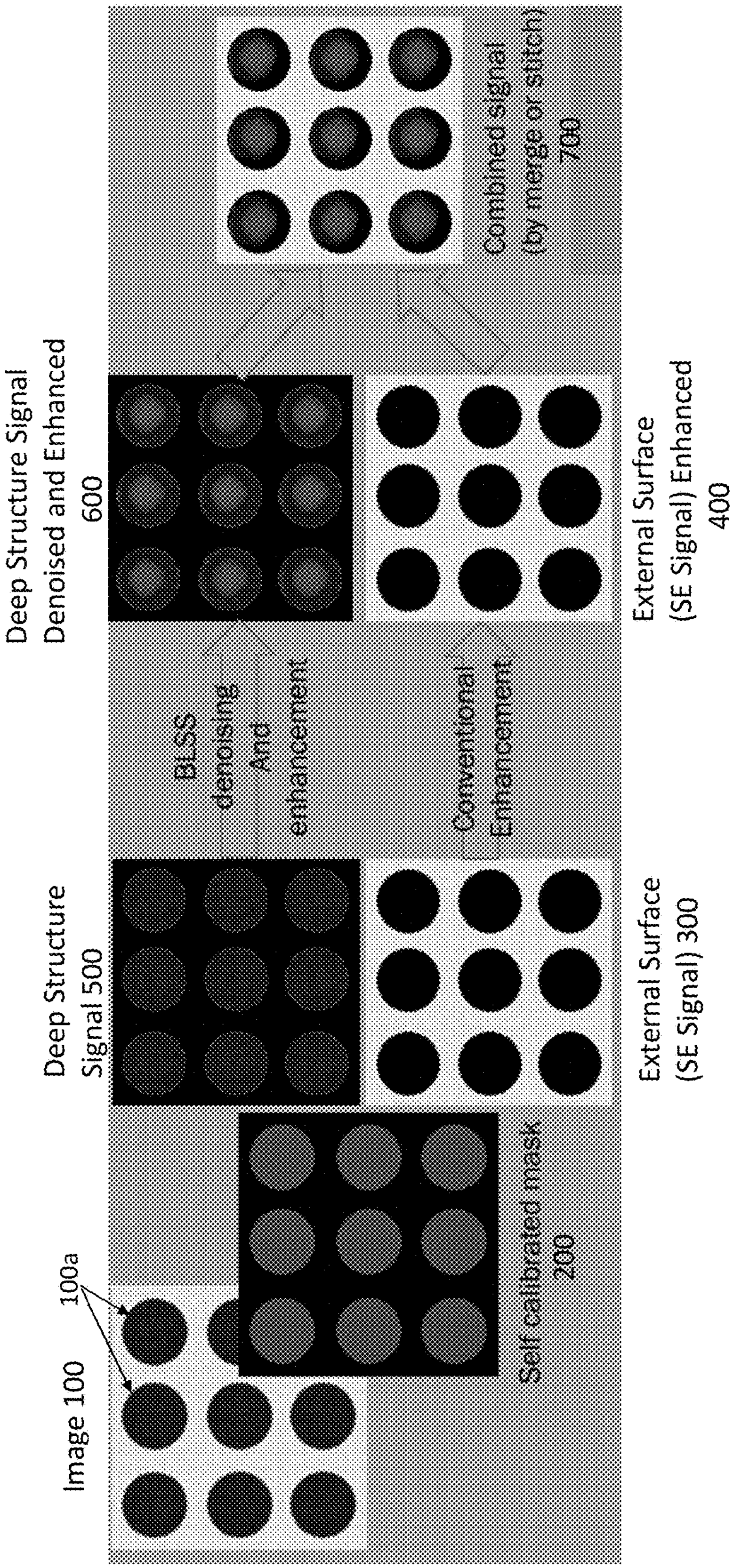
FIG. 2 illustrates a process of obtaining a denoised and enhanced deep structure measurement of a semiconductor image using blind denoising by self-supervision (BDSS) and separately obtaining a denoised and enhanced external surface measurement of the semiconductor image, according to an example embodiment of the present inventive concept.
Figure 3:
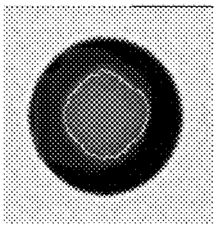
FIG. 3 illustrates a resulting denoised and enhanced measurement of both the deep structure (lower level) and external surface (upper level) of a semiconductor structure, recombined, from the process illustrated in FIG. 2.

The drawings illustrate a few example embodiments of the present inventive concept, and are not to be considered limiting in its scope, as the overall inventive concept may admit to other equally effective embodiments. The elements and features shown in the drawings are to scale and attempt to clearly illustrate the principles of exemplary embodiments of the present inventive concept. In the drawings, reference numerals designate like or corresponding, but not necessarily identical, elements throughout the several views.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. Also, while describing the present general inventive concept, detailed descriptions about related well-known functions or configurations that may diminish the clarity of the points of the present general inventive concept are omitted.

It will be understood that although the terms “first” and “second” may be used herein to describe various elements, these elements should not be limited by these terms. These terms are only used to distinguish one element from another element. Thus, a first element could be termed a second element, and similarly, a second element may be termed a first element without departing from the teachings of this disclosure.

Expressions such as “at least one of,” when preceding a list of elements, modify the entire list of elements and do not modify the individual elements of the list.

All terms including descriptive or technical terms which are used herein should be construed as having meanings that are obvious to one of ordinary skill in the art. However, the terms may have different meanings according to an intention of one of ordinary skill in the art, case precedents, or the appearance of new technologies. Also, some terms may be arbitrarily selected by the applicant, and in this case, the meaning of the selected terms will be described in detail in the detailed description of the invention. Thus, the terms used herein have to be defined based on the meaning of the terms together with the description throughout the specification.

Also, when a part "includes" or "comprises" an element, unless there is a particular description contrary thereto, the part can further include other elements, not excluding the other elements. In the following description, terms such as "unit" and indicate a unit to process at least one function or operation, wherein the unit may be embodied as hardware or software or embodied by combining hardware and software.

Hereinafter, one or more exemplary embodiments of the present general inventive concept will be described in detail with reference to accompanying drawings.

The subject matter regarded as the embodiments of the disclosure is particularly pointed out and distinctly claimed in the concluding portion of the specification. The embodiments of the disclosure, however, both as to organization and methods of operation, together with objects, features, and advantages thereof, may best be understood by reference to the following detailed description when read with the accompanying drawings.

Because the illustrated embodiments of the disclosure may be implemented using electronic components and circuits know to those skilled in the art, details will not be explained in any greater extent than that considered necessary as illustrated, for the understanding and appreciation of the underlying concepts of the present example embodiments described herein and in order not to obfuscate or distract from the overall inventive concept as described herein.

Any reference in the specification to a method should be applied mutatis mutandis to a system capable of executing the method and should be applied mutatis mutandis to a computer readable medium that is non-transitory and stores process steps for executing the method.

Any reference in the specification to a system should be applied mutatis mutandis to a method that may be executed by the system and to a computer program that stores instructions for executing the method.

Any reference in the specification to a computer program product should be applied mutatis mutandis to a method that that is performed when executing instructions stored in the computer program product and to a system that is configured to execute the instructions stored in the computer program. The computer program product is non-transitory and may include a non-transitory medium for storing instructions. Non-limiting examples of the computer program product are a memory chip, an integrated circuit, a disk, and a magnetic memory unit.

There may be provided a method for generating an image that includes an upper surface (external) and a lower surface (deep structure). The upper and lower surfaces have nanometric dimensions and high aspect ratios, where the aspect ratio is the ratio between a depth of an image and a width of an image.

The following example refers to an object. The object may be a semiconductor wafer, or any other object that has a high aspect ratio of nanometric dimensions.

An image may include pixels that are taken of an image of an upper surface of an area of an object and a lower level (deep structure) of an area of an object.

In accordance with an example embodiment of the present inventive concept an electron beam (not illustrated) is targeted onto an object, such as a semiconductor wafer. The object includes at least two layers of components formed thereon. The electron beam is used to capture an image of an area on an upper layer and an image of an area on a lower (or bottom) layer of the object. The upper topography of the upper layer defines the surroundings of the deep structure, while the bottom layer defines the deep structure itself. In this example embodiment different image enhancement techniques are applied to each of the upper and lower images captured by electrons of the electron beam reflecting/deflecting off the object. While the treatment of the upper topography is common and does not require elaborate enhancement due to the strong signal-to-noise ratio (SNR) of the top topography, a different treatment approach for the bottom of the deep structure, according to an example embodiment of the present inventive concept, is provided. In other words, the noise distribution and SNR for the bottom layer and the upper layer are entirely different, and therefore, according to an example embodiment of the present inventive concept, different denoising and enhancement techniques are applied to upper and lower layers of the captured image. This process can be performed by first separating the image into top (upper topography) and bottom (deep signal) regions. In accordance with an example embodiment of the present inventive concept, the image of an area of an object obtained using an electron beam can be divided into two regions (upper and bottom) using self-tunable (or self-calibrating) masking technique, such as by using the self calibrated mask 200, illustrated in FIG. 2. Examples of self-tunable masking can be performed by a number of well-known segmentation algorithms. After dividing the image into separate upper and lower regions, the upper region, separated from the lower (or bottom) region, can be denoised and enhanced (treated) by conventionally known techniques, such as, for example, spatial domain filtering and then stretching, and therefore will not be described in significant detail here in order to provide brevity to the detailed description of the present inventive concept.

The bottom region (deep structure) of the captured object can then be treated using blind denoising by self-supervision (BDSS) and local enhancement. An important reason for the two different processes being applied to the upper and lower regions is due to the noise distribution and the SNR of the deep structure (in the bottom region) being entirely different than that in the upper structure or structures. This process will be described in more detail below with reference to FIG. 2, and a flow chart of the process of FIG. 2 is illustrated in FIG. 4.

Figure 4:
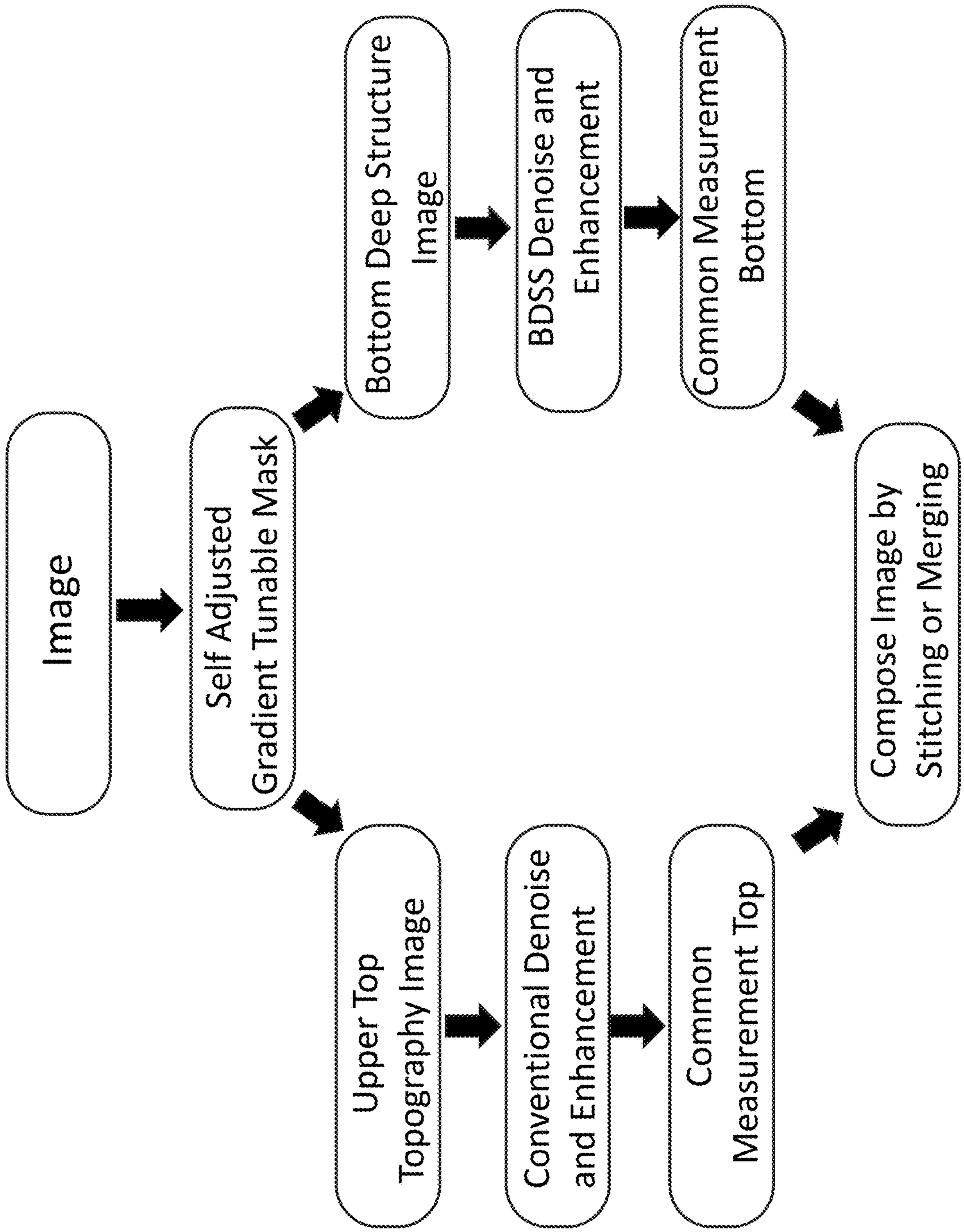
FIG. 4 illustrates a flowchart of the process of obtaining a denoised and enhanced deep structure measurement of a semiconductor image using blind denoising by self-supervision (BDSS) and separately obtaining a denoised and enhanced external surface measurement of the semiconductor image, according to the example embodiment of FIG. 2.

Referring to FIG. 2 and FIG. 4, an area of an object (i.e., a semiconductor structure) with deep contacts can be captured as an image 100 by using a charged particle imager. An electron beam will be referred to herein as the charged particle imager, although alternative equivalent electron beam emission devices can be used to obtain an image of an object having a plurality of layers. The obtained image 100 illustrates a plurality of deep contacts **100*a*. Then a self-calibrating (or self-tunable) mask 102 can be applied to the image 100 to divide the image 100 into an external surface signal image 300 and a deep structure signal image 400**. A well-established method for image masking is by using an Otsu algorithm. Otsu's method is used to automatically determine an optimal threshold value to separate an image into foreground and background regions. The Otsu's thresholding method operates by analyzing the histogram of an image. The histogram represents the distribution of pixel intensities in the image, showing how many pixels have a particular intensity value. The goal of Otsu's method is to find a threshold value that minimizes the intra-class variance of pixel intensities, maximizing the inter-class variance. Without going into details of the step-by-step process performed using the Otsu threshold method, by using Otsu's thresholding method, we can obtain a binary image where foreground objects are separated from the background. This technique is commonly used in various computer vision and image processing applications, such as image segmentation, object detection, and image thresholding. Another well established method for image masking is by using a Sauvola algorithm. Still another established method for masking is referred to as Background Cancellation. However, as pointed out, the process of masking is known to those of ordinary skill in the art.

The external surface signal image 300 can then be denoised and enhanced by well-known processes of denoising and stretching with high SNR to ensure a stable measurement of this external signal. As a result, an external surface enhanced signal 400 can be obtained.

In contrast with the external surface signal image 300 denoising and enhancement, the bottom deep structure image 500 will undergo a process of blind denoising by self-supervision (BDSS). More specifically, (BDSS) is an approach to image denoising that leverages self-supervised learning techniques. BDSS aims to remove noise from images without requiring any prior knowledge regarding the noise statistics or access to clean reference images. BDSS is a deep learning-based method that learns to denoise images using only the noisy observations themselves. BDSS can be performed by the following process as described below.

First, a large dataset of noisy images is created by synthetically adding noise to clean reference images. The noise can be modeled as additive white Gaussian noise (AWGN). However, other types of noise commonly encountered in imaging applications can be used which will provide the intended purposes as described herein.

Second, a deep convolutional neural network (CNN) can be designed as the denoising model. This network takes a noisy image as input and produces a clean denoised image as an output.

Third, the self-supervised training process can be performed in two steps: a) the convolutional neural network (CNN) is used to generate a denoised version of the noisy input image. This process is referred to as "Noisy Image Generation;" and b) a "loss function" is defined to compare the denoised output with the original noisy image. Commonly used loss functions include mean squared error (MSE) or perceptual loss based on feature comparisons.

Fourth, the training objective is to train the convolutional neural network (CNN) to minimize the defined loss function, encouraging the CNN to learn the underlying structure and remove noise from the input images. The training process involves multiple iterations or epochs. The convolutional neural network (CNN) is repeatedly trained on batches of noisy images, optimizing its parameters to improve denoising performance.

Fifth, after training the convolutional neural network (CNN), the trained denoising CNN can be used to process unseen noisy images. In other words, the trained denoising CNN takes the noisy input and applies the learned denoising transformations to produce a clean denoised output.

Important advantages of the Blind Denoising by Self Supervision include its ability to learn denoising directly from noisy observations without requiring any clean reference images. By leveraging large-scale training datasets, the trained denoising CNN can capture complex noise patterns and effectively remove noise from real-world images.

After the bottom deep structure layer 500 undergoes BDSS, this bottom deep structure layer 500 can be locally enhanced by one of many known methods, such as, for example application of a histogram or kernel methods, etc.

As a result of performing Blind Denoising by Self Supervision and enhancement of the bottom deep structure layer 500 a deep structure signal denoised and enhanced version 600 can be obtained.

If one enhanced image from the two images 400 and 600, then the top and bottom region images 400 and 600 can be equalized to ensure proper stitching or merging (combining the two processed images 400 and 600). However, from an algorithmic point of view measurement of the resulting top and bottom images 400 and 600 can be performed separately.

While certain features of the example embodiments of the present inventive concept as described herein have been illustrated and described, many modifications, substitutions, changes, and equivalents will now occur to those of ordinary skill in the art. It is therefore to be understood that the appended claims are intended to cover all such modifications and changes as fall within the spirit and scope of the embodiments as described herein.

The embodiments described herein may also be implemented in a computer program to be used to run a computer system, at least including code portions for performing process steps according to the embodiments when run on a programmable apparatus, such as a computer system, or enabling a programmable apparatus to perform functions of a device or system according to the example embodiments.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

The invention claimed is:

1. A method of deep structure detection for a critical dimension scanning electron microscope (CDSEM) image, the method comprising:
- obtaining an image of an area of a semiconductor structure having at least two layers using a charged particle imager;
- obtaining an upper topography region and a bottom deep structure region by applying a self-tunable mask to the obtained image of the area of the semiconductor structure;
- denoising and enhancing the upper region topography;
- applying blind denoising by self-supervision (BDSS) to the bottom deep structure region and locally enhancing the denoised bottom deep structure region; and
- combining the denoised and enhanced upper region topography and the denoised and enhanced bottom deep structure region to obtain a single denoised enhanced image.

2. The method according to claim 1, wherein enhancing the denoised bottom deep structure region is performed by applying a histogram or a kernel method thereto.

3. The method according to claim 1, wherein denoising and enhancing the upper region topography is performed by spatial domain filtering and stretching.

4. A non-transitory computer readable medium that stores instructions to perform process steps comprising:
- controlling a charged particle imager to obtain an image of an area of a semiconductor structure having at least two layers;
- obtaining an upper topography region and a bottom deep structure region by applying a self-tunable mask to the obtained image of the area of the semiconductor structure;

denoising and enhancing the upper region topography;

applying blind denoising by self-supervision (BDSS) to the bottom deep structure region and locally enhancing the denoised bottom deep structure region; and combining the denoised and enhanced upper region topography and the denoised and enhanced bottom deep structure region to obtain a single denoised enhanced image.

5. The non-transitory computer readable medium according to claim 4, wherein enhancing the denoised bottom deep structure region is performed by applying a histogram or a kernel method thereto.

6. The non-transitory computer readable medium according to claim 4, wherein denoising and enhancing the upper region topography is performed by spatial domain filtering and stretching.

* * * * *